United States Patent [19]

Kukanskis

[11] Patent Number: 4,735,694

[45] Date of Patent: Apr. 5, 1988

[54] METHOD FOR MANUFACTURE OF PRINTED CIRCUIT BOARDS

[75] Inventor: Peter E. Kukanskis, Woodbury, Conn.

[73] Assignee: MacDermid, Incorporated, Waterbury, Conn.

[21] Appl. No.: 875,613

[22] Filed: Jun. 18, 1986

[51] Int. Cl.⁴ .............................................. C25D 5/02
[52] U.S. Cl. ..................................... 204/15; 204/38.5
[58] Field of Search ....................... 204/15, 38.4, 38.5, 204/38.1, 40

[56] References Cited

U.S. PATENT DOCUMENTS

| | | | |
|---|---|---|---|
| 2,959,525 | 11/1960 | Ritt, Jr. | 204/15 |
| 3,297,442 | 1/1967 | Spiers | 430/314 |
| 3,483,615 | 12/1969 | Gottfried | 29/852 |
| 3,673,680 | 7/1972 | Tanaka | 204/15 |
| 4,104,111 | 8/1978 | Mack | 156/656 |
| 4,135,988 | 1/1979 | Dugan | 204/15 |
| 4,312,897 | 1/1982 | Reimann | 427/97 |
| 4,436,806 | 3/1984 | Rendulic | 430/311 |
| 4,444,619 | 4/1984 | O'Hara | 156/645 |
| 4,512,829 | 4/1985 | Ohta | 156/659.1 |

OTHER PUBLICATIONS

Circuits Manufacturing, Aug., 1982, pp. 45–48.
PC FAB, Dec. 1981, pp. 16, 51–55.
Handbook of Printed Circuit Manufacturing, R. H. Clark, 1985, pp. 564–570.

*Primary Examiner*—T. M. Tufariello
*Attorney, Agent, or Firm*—St. Onge Steward Johnston & Reens

[57] ABSTRACT

A method of preparing printed circuit boards is described in which the solder mask on the circuit pattern and, optionally, the solder on the through-holes surrounding pads, and like areas to receive solder, is applied over a layer of lead covering the copper layer at said loci. This method eliminates the need to strip tin-lead alloy etch resist which step is commonly employed in prior processes. The method overcomes the problems associated with migration of tin into the copper layer which can occur when tin-lead alloys are applied directly over copper.

15 Claims, No Drawings

METHOD FOR MANUFACTURE OF PRINTED CIRCUIT BOARDS

BACKGROUND OF THE INVENTION

The present invention relates to printed circuit boards of the type having a solder mask over non-reflowable metal and, more particularly, to a method of manufacture of such circuit boards and to the printed circuit boards resulting therefrom.

As is well-known in the art, the manufacture of double-sided printed circuit boards requires the provision of conductive through-holes for interconnecting components on opposite sides of the board or, in the case of multilayer printed circuit boards, for interconnecting the inner layers. The non-conductive surfaces exposed when through-holes are drilled in a non-conductive substrate having metal cladding on both sides must, therefore, be provided with a conductive coating, and this generally is accomplished by a first electroless deposition of copper onto the suitably conditioned through-hole surfaces, followed by electroplating of copper to build up additional thickness.

In application of the actual circuit patterns to the metal-clad board surfaces, it is necessary to employ plating resists so as to prevent all but particular areas of the board (through-holes and/or traces and/or pads and/or other areas) from receiving applied metal platings such as the copper electroplate used in through-hole plating and/or the commonly employed tin-lead alloy etch resist which is applied prior to the step of etching away copper so as to form the appropriate conductive circuit pattern.

The use of tin-lead alloys as etch resists has the disadvantage that resists have to be stripped after the etching process is completed. Such stripping contributes additional costs due to consumption of both time and additional materials as well as presenting environmental problems in disposal of the materials used.

A further problem encountered with the use of tin-lead etch resist is the formation of minute slivers of the metal during the removal process. These slivers can result in short circuits but are virtually impossible to detect even under magnification.

The tin-lead alloy solder which is applied to through-holes and pads in a later step of the fabrication tends to melt under the solder mask which has been applied to the copper circuit pattern to protect the latter. The tin in the alloy tends to migrate from the solder to the underlying copper circuit traces. This can give rise to galvanic action with subsequent corrosion and deleterious effects on the performance of the board. Further, the migration of tin from the solder into the underlying copper leaves the solder rich in lead and thereby structurally weakened and prone to fracture. When the solder forms the point of attachment of a surface mount device (SMD) the possibility of fracture is increased because of the stress placed on the joint due to the difference in thermal coefficient of expansion of the printed circuit board and the SMD and the effect of repeated heating and cooling during the working life of the board.

The various drawbacks recited above are well recognized in the art and attempts have been made to overcome the same. Illustratively, R. C. Clark, SMOBC: Manufacturing Techniques, Circuits Manufacturing, August, 1982 pp. 45-48 and R. H. Clark, Handbook of Printed Circuit Manufacturing, pp. 564-570, Van Nostrand Reinhold Company, New York, 1985, both describe the use of tin alone, tin-nickel alloys, nickel alone and black oxide as etch resists. However, while these alternatives avoid the use of tin-lead alloy resists they are not entirely free from disadvantages. Thus, adhesion of the solder mask to the surface of these alternate metals can be poor unless surface processing is carried out prior to application of the solder mask. This extra step can have a detrimental effect on circuit integrity. Further, the alternative metal resists must be well activated prior to applying the solder mask in order to avoid poor electrical conductivity and/or peeling of the solder mask. In the case of nickel the possibility of minute sliver formation exists with the deleterious consequences discussed above in the case of tin-lead.

J. D. Fellman PC FAB, December 1981, p. 16 and 51-55 describes the use of electroless tin plated etch resists wich, however, are stripped before applying solder mask.

Mack U.S. Pat. No. 4,104,111 describes the use of tin-nickel as an etch resist over the copper circuit traces. However, a cleaning and chemical reactivation of the tin-nickel layer is necessary prior to application of solder mask thereto. Spiers U.S. Pat. No. 3,297,442 employs a layer of gold as an oxidation resistant coating for copper circuit traces but an additional etching resist is employed prior to the etching step. Gottfried U.S. Pat. No. 3,483,615 and Reimann U.S. Pat. No. 4,312,897 also teach the use of gold as an etch resist for printed circuit boards. The use of such an expensive etch resist is obviously to be avoided, if possible.

Ritt et al U.S. Pat. No. 2,959,525 describes the plating of copper circuit patterns with nickel and, optionally, with rhodium but not until after the etching steps in formation of the circuitry have been completed, i.e. the nickel and rhodium layers are not employed as etch resists.

Ohta et al U.S. Pat. No. 4,512,829 describes a process for producing printed circuit boards in which a key step is electroless plating of the hole-defining inner surfaces without deposition of nickel on the copper clad surfaces. Deposition on the latter is avoided because the etch resistance of the nickel would interfere with subsequent etching of the copper.

O'Hara U.S. Pat. No. 4,444,619 employs a palladium/nickel alloy as an etching resist in fabrication of printed circuit boards. Preferred is an alloy containing 65 to 95 percent palladium.

Rendulic et al U.S. Pat. No. 4,436,806 describes the use of liquid polymer photoresists in the fabrication of printed circuit boards. A metallic plate resist, which can be tin, lead, nickel or a combination thereof, is optionally employed to protect the copper circuit pattern during the etching step.

It has now been found that the problems discussed in regard to the use of tin-lead etch resists and in regard to melting of solder under the solder mask can be overcome readily by utilizing metallic lead as the etch resist and thereafter applying solder mask directly over the layer of metallic lead since the lead does not melt at normal soldering temperatures. Further, if a layer of lead is present on the surface of the copper at the various loci to which solder is applied the problems of weakening of soldered joints discussed above are found to be obviated or greatly reduced. It is believed that lead acts as a barrier metal for tin migration from the tin-lead solder to the copper. In addition to overcoming the problems discussed above, the use of lead as the etch resist following by applying solder mask directly over the lead has the advantage of eliminating the need to strip the etch resist.

SUMMARY OF THE INVENTION

It is an object of the invention to provide an improved printed circuit board, and a method for preparing the same, in which the solder mask on the copper circuit tract pattern is applied over a layer of lead.

It is a further object of the invention to provide an improved process for fabricating a printed circuit board in which lead is employed as the etch resist and is not stripped prior to application of solder mask over the board including the copper circuit trace pattern.

It is yet another object of the invention to provide an improved circuit board, and a method for preparing the same, in which both the solder mask on the board including the copper circuit trace pattern and the solder on the through-holes and surrounding pads are applied over a layer of lead covering the copper at these loci.

These objects, and other objects which will become apparent as the following description unfolds, are achieved by the process and products of the present invention.

The process of the invention in one aspect comprises an improved process for fabricating printed circuit boards in which a non-conductive substrate having copper foil laminated to both sides thereof and having through-holes made therein is first subjected to electroless deposition of further copper on the foil surfaces and through-holes and surrounding pads. A trace pattern of the circuit is imaged on the copper layer using conventional procedures and additional copper thickness is deposited by electroplating on the trace and through-holes, surrounding pads, and, if present, any lands to which SMD's are to be attached. Thereafter a continuous layer of lead is electroplated on these same areas and the plating resist remaining from the imaging process is removed. The copper surfaces from which the plating resist has been removed are then etched away in conventional manner leaving the lead-coated circuit trace pattern, through-holes, surrounding pads and SMD lands if present. Solder mask is then applied, using conventional techniques, to the board surface including the lead-coated circuit trace pattern but not to the through-holes, surrounding pads SMD lands and any other such loci which are to have solder applied thereto. These various sites are referred to collectively hereafter as "loci to receive solder". Solder is applied to the latter (using conventional techniques) either over the lead coating or, optionally, after removing the lead coating using an acid dip to expose the underlying layer of copper.

In a modification of the above embodiment the application of solder over the lead coated loci to receive solder can be carried out at an earlier stage. In this modification a second plating resist is applied to the lead coated circuit traces immediately after the electroplating of the lead layer has been carried out. With the second plating resist in place the solder is applied to the loci to receive solder. Thereafter the first plating resist (from the imaging process) and the second plating resist are removed in a single step, followed by etching of exposed copper, application of solder mask to the board including the lead coated circuit traces and, finally, reflowing of the solder previously applied. This optional step provides the additional advantage of inhibiting migration of the tin from the solder into the underlying copper layer at the loci in question thereby achieving the desirable results discussed previously.

In addition to fabrication of the particularly types of printed circuit board discussed in the above embodiments, one skilled in the art will readily appreciate that the process of the invention, the key feature of which is the application of solder mask over a layer of lead deposited on the copper circuit traces and, optionally, the application of solder over a layer of lead on the through-holes, pads and other such loci required to receive solder, can also be employed in the fabrication of other types of printed circuit board including single sided boards, multilayer boards, semi-additive boards and the like. While the process of the invention will be discussed hereinafter by application to the fabrication of double sided boards, these embodiments are given for purposes of illustration only and the scope of the invention is not limited thereto.

The invention also comprises the printed circuit boards produced by the above processes.

DETAILED DESCRIPTION OF THE INVENTION

The process of the invention is carried out broadly in accordance with procedures and using materials conventionally employed in the art to fabricate printed circuit boards of the various types set forth above but with the principal exception that a layer of lead is employed as etch resist, in place of the tin-lead alloy etch resists commonly used in the art hitherto, and that the layer of lead is not removed from the circuit traces prior to application of solder mask thereto and, optionally, not removed from the loci to receive solder prior to application of solder thereto.

Thus, in one embodiment, the method of the invention makes use of a conventional non-conductive substrate, containing through-holes and having a copper layer such as copper foil laminated on both sides of the substrate. The copper foil surfaces and the exposed non-conductive through-hole surfaces are then treated according to any known electroless copper depositing process (including the various conditioning, activating, accelerating, and rinsing steps involved in conditioning the surfaces and securing suitable deposition) to deposit a layer of copper thereon, generally of about 40 to $120 \times 10^{-6}$ inches in thickness.

Alternatively, the non-conductive substrate, without copper foil laminated thereto on both sides, can have a layer of copper plated directly thereon in accordance with the conventional semi-additive process.

A plating resist, which can be any of those conventionally employed in the art, is then applied to the copper surfaces. Such resist include inks which are etch resistant and which are applied by stencil or screening or other known techniques. Generally, the resist will be a photosensitive type (negative or positive-acting) and can be of the dry film or liquid type. Dry film resists will be employed where it is desired that certian through-holes receive no further coatings or treatments, since the dry film will easily tent over and protect these holes. Preferably the resist will be a negative photoresist in which the exposure to light results in insolubilizing of the resist material, while those areas not exposed to light remain in a form which permits dissolution and removal with a suitable developer. The loci to receive solder in a subsequent step are not protected with plating resist material. An electroplated copper coating is applied to these loci as well as to the pattern traces created in the photoresist (plating resist). Any of the known plating techniques and baths can be employed.

In the next step of the process of the invention a continuous layer of lead is applied to the pattern traces and loci to receive solder. The lead layer is advantageously applied to electroplating using any of the known plating techniques with appropriate baths. Illustrative of such processes is that which is marketed under the name REFLECTIN-LEAD (RTL) No. 326 PROCESS by MacDermid, Inc., Waterbury, Ct. This process employs a bath containing lead fluoborate, fluoboric acid, and boric acid in aqueous solution. The plating resist is thereafter removed using techniques well-known in the art. The copper layers which had been covered by the plating resist are then etched away using standard techniques and using copper etchants which do not attack the lead layer on the circuit traces and loci to receive solder. Solder mask is then applied over the surface of the board including the lead-coated circuit traces but not over the loci to receive solder. Any of the known solder masks can be used and applied in accordance with standard techniques such as screen printing and the like. The application of the solder mask over the lead layer represents a significant departure from prior art procedures as discussed previously.

In the final step of the process of the invention, solder is applied to the areas not protected by solder mask. The solder can be applied directly over the lead layer at these loci or, optionally, the lead layer can be stripped therefrom and the solder applied directly over bare copper so exposed. Where the lead stripping step is employed the stripping can be carried out advantageously by immersing the board in an acid stripping bath for a brief period until bare copper is exposed at the loci in question. Illustrative of the stripping baths, which are preferably maintained at a temperature of about 20° C. to about 70° C., are aqueous solutions containing a mixture of nitric and fluoboric acids, aqueous solutions containing nitroaromatic sulfonic acids such as m-nitrobenzene sulfonic acids optionally in admixture with fluoboric acid, and the like.

In an optional step, an organic protective coating such as that available under the trade name SEAL-BRITE from London Chemical Company is applied to the clean copper surfaces after stripping of the lead coating. This coating serves to protect the copper from air oxidation prior to application of the solder and has the advantage that it acts as a flux during application of solder and therefore does not need to be removed prior to the soldering process.

The application of solder to the through-holes and surrounding pads, either over the lead layer or after stripping the latter as described above, is carried oout using conventional techniques such as immersion in a solder bath followed by the known hot air levelling process.

In an alternative embodiment of the process of the invention the series of steps described above for the previous embodiment is modified in the following manner. The initial steps of the said previous embodiment are carried out as before until the layer of lead has been electroplated onto said copper-plated circuit traces and loci to receive solder. At this stage of the process a second plating resist, which can be the same as the first one applied in the earlier step of the process or can be a different one selected from those conventionally employed in the art, is applied over the lead coating on the copper circuit traces but not over the lead coating on the loci to receive solder. Thereafter solder is applied to the latter, using any of the techniques conventional in the art, optionally after removing the coating of lead from said loci using the techniques discussed above in regard to the previous embodiment of the invention. The first and second plating resists are then removed as described in regard to the previous embodiment and the subsequent steps of etching to remove exposed copper and application of solder mask to the board including the lead coated circuit traces are carried out as before. The final step of this alternative embodiment comprises reflowing of the solder previously applied using any of the techniques conventional in the art.

The embodiments described above have been given for purposes of illustration only and are not to be construed as limiting. Other modifications which can be made without departing from the scope of the present invention will be readily apparent to one skilled in the art.

What is claimed is:

1. A method for manufacturing printed circuit boards said method comprising the steps of:
   (a) providing a non-conductive substrate having a copper layer on both sides thereof and having through-holes made therein;
   (b) electrolessly depositing copper on the copper layer and through-hole and surrounding pad surfaces;
   (c) applying a resist image of a trace pattern on said copper layer;
   (d) subjecting the resulting substrate to a copper electroplating process to deposit additional copper thickness on all exposed copper surfaces including said trace pattern and said through-hole and surrounding pad surfaces;
   (e) electroplating a continuous layer of lead on all exposed copper surfaces including said copper-plated trace pattern, through-holes and surrounding pad surfaces;
   (f) removing the imaged material;
   (g) removing all copper from those areas not protected by said layer of lead;
   (h) selectively applying a solder mask to said board including lead coated trace pattern but not to loci which are to receive solder; and
   (i) applying solder to the latter loci.

2. A method according to claim 1 wherein step (i) is carried out by immersion in a bath of solder followed by a hot air levelling.

3. A method according to claim 2 wherein said solder is applied without first removing the said layer of lead from said loci which are to receive solder.

4. A method according to claim 1 wherein the layer of lead on said loci which are to receive solder is removed prior to applying solder thereto.

5. A method according to claim 4 wherein said layer of lead is stripped using an acid bath.

6. A method according to claim 1 which comprises the additional steps, introduced after step (e), of applying a second plating resist to said layer of lead on said trace patterns and thereafter applying solder to the remaining lead coated copper loci prior to carrying out step (f) which removes said second plating resist in addition to the plating resist material remaining on the substrate from step (c).

7. A method according to claim 6 wherein the final step (i) comprises reflowing the solder which has been applied, in the second of said additional steps.

8. A method for manufacturing printed circuit boards containing conductive through-holes, conductive pads surrounding said through-holes and conductive copper traces forming a circuit pattern on said board, and wherein said pads and through-holes are provided with a solder coating and said copper traces are coated with a non-reflowable metal and provided with a solder mask, said method comprising the steps of:
 (a) providing a non-conductive substrate having copper foil laminated to both sides thereof and having through-holes made therein;
 (b) electrolessly depositing a copper layer on the copper foil and through-hole and surrounding pad surfaces;
 (c) applying a trace pattern on said copper layer;
 (d) subjecting the resulting substrate to a copper electroplating process to deposit additional copper thickness on all exposed copper surfaces including said trace pattern and said through-holes and surrounding pad surfaces;
 (e) electroplating a continuous layer of lead on all exposed copper surfaces including said copper plated trace pattern, through-holes and surrounding pad surfaces;
 (f) removing the imaged material;
 (g) removing all copper from areas not protected by said layer of lead;
 (h) applying a solder mask to said board including the lead coated trace pattern but not to loci including said through-holes and surrounding surfaces which are to receive solder; and
 (i) applying the solder to the latter loci.

9. A method according to claim 8 wherein the solder is applied without first removing said layer of lead from said loci to receive solder.

10. A method according to claim 8 wherein the layer of lead on said loci which are to receive solder is removed prior to applying solder thereto.

11. A method according to claim 8 which comprises the additional steps, introduced after step (e), of applying a second plating resist to said layer of lead on said trace patterns and thereafter applying solder to the remaining lead coated copper loci prior to carrying out step (f) which removes said second plating resist in addition to the plating resist material remaining on the substrate from step (c).

12. A method according to claim 11 wherein the final step (i) comprises reflowing the solder which has been applied in the second of said additional steps.

13. In a process for the preparation of a circuit board wherein the copper circuit traces are coated with a non-reflowable metal and provided with a solder mask over said non-reflowable metal the improvement which comprises employing lead as said non-reflowable metal.

14. A process according to claim 13 wherein said circuit board is provided with through-holes and surrounding pads covered with solder.

15. A process according to claim 14 wherein said through-holes and surrounding pads are coated with a layer of lead over which the solder is applied.

* * * * *